United States Patent [19]
Jefferson

[11] Patent Number: 5,642,082
[45] Date of Patent: Jun. 24, 1997

[54] LOOP FILTER LEVEL DETECTION CIRCUIT AND METHOD

[75] Inventor: David Edward Jefferson, San Jose, Calif.

[73] Assignee: Altera Corporation, San Jose, Calif.

[21] Appl. No.: 668,265

[22] Filed: Jun. 20, 1996

[51] Int. Cl.$^6$ ............................. H03L 7/00; H03L 7/089
[52] U.S. Cl. ..................... 331/25; 331/1 A; 331/8; 331/14; 331/17; 327/157; 327/158; 327/159
[58] Field of Search ........................ 331/1 A, 8, 14, 331/17, 18, 25, DIG. 2; 327/142, 156–159

[56] References Cited

U.S. PATENT DOCUMENTS

| | | | |
|---|---|---|---|
| 4,871,930 | 10/1989 | Wong et al. | 307/465 |
| 5,204,555 | 4/1993 | Graham et al. | 307/465 |
| 5,260,611 | 11/1993 | Cliff et al. | 307/465 |
| 5,347,233 | 9/1994 | Ishibashi et al. | 331/25 X |

OTHER PUBLICATIONS

U. Ko et al., "A 30-ps Jitter, 3.6-μs Locking, 3.3-Volt Digital PLL For CMOS Gate Arrays", IEEE 1993 Custom Integrated Circuits Conference, pp. 23.3.1–4.

A. Efendovich et al., "Multi–Frequency Zero–Jitter Delay––Locked Loop", IEEE 1993 Custom Integrated Circuits Conference, pp. 27.1.1–4.

A. Efendovich et al., "Multifrequency Zero–Jetter Delay––Locked Loop", IEEE Journal of Solid–State Circuits, vol. 29, No. 1, Jan. 1994, pp. 67–70.

A. Walzman, "A Delay Line Loop for Frequency Synthesis of De–Skewed Clock", IEEE International Solid–State Circuits Conference 1994, pp. 298–299.

*Primary Examiner*—David Mis
*Attorney, Agent, or Firm*—Fish & Neave; Robert R. Jackson

[57] ABSTRACT

A loop circuit such as a delay lock loop or a phase lock loop includes circuitry for detecting when the output signal of the low-pass filter in the loop has either risen to a voltage which is relatively close to the power voltage of the circuit or has fallen to a voltage which is relatively close to the ground voltage of the circuit. In either case the circuitry reverses the significance of the phase frequency detector output signals that control whether the output voltage of the low-pass filter rises or falls. Alternatively or in addition, the phase frequency detector may be reset. Coarser adjustments may be made to the loop circuit downstream from the low-pass filter in response to a recurrence of the low-pass filter output voltage reaching either of the detected voltages mentioned above.

19 Claims, 6 Drawing Sheets

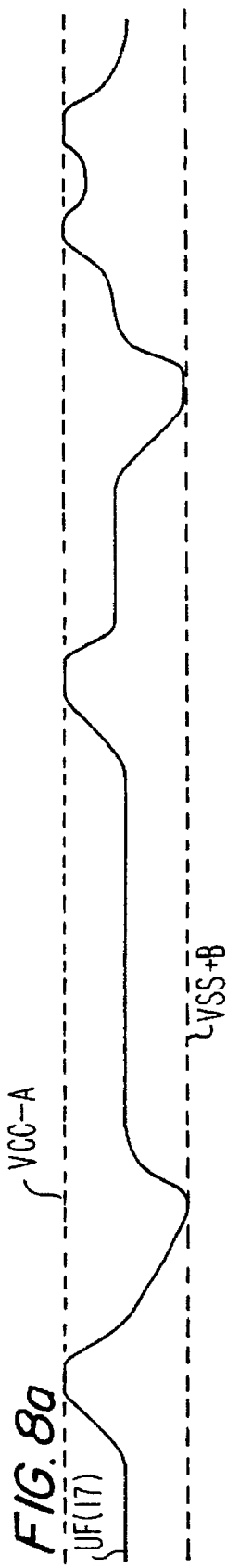
FIG.8a UF(17)
FIG.8b RESET(147)
FIG.8c EN1(171)
FIG.8d EN2(173)

LOOP FILTER LEVEL DETECTION CIRCUIT AND METHOD

CROSS REFERENCE TO RELATED APPLICATION

This application claims the benefit of United States provisional application No. 60/015,105, filed Apr. 11, 1996.

BACKGROUND OF THE INVENTION

This invention relates to electronic circuits of the types known as delay lock loops and phase lock loops.

Delay lock loop and phase lock loop circuits may be used to produce a clock signal which has a particular time shift relative to a reference clock signal. Although the clock signal produced by the loop circuit can be delayed relative to the reference clock, a common need is for a clock signal that is advanced relative to the reference clock. Thus, for convenience herein, all signals produced by a loop circuit will be referred to as "advanced clock signals", whether the signal is advanced or delayed relative to the reference clock.

An illustrative situation in which there may be a need for an advanced clock signal occurs in relatively large integrated circuit ("IC") devices such as programmable logic arrays. The reference clock signal may be applied to one input pin of the IC for distribution throughout the device. By the time the reference clock signal reaches portions of the IC that are relatively remote from the input pin, the signal may be significantly delayed (due to signal transmission delay in the IC) relative to the reference clock signal adjacent to the input pin. This can make it difficult to maintain synchronization between the various portions of the IC, and it may necessitate operating the IC at a slower clock rate than would otherwise be possible.

In order to compensate for this problem, a delay lock loop circuit or a phase lock loop circuit may be included on the IC. (For convenience herein, both of these types of circuits are referred to generically as "loop circuits".) The loop circuit is typically located near the reference clock input pin. The loop circuit receives the reference clock signal and produces an advanced clock signal. The advanced clock signal is generally similar to the reference clock signal, except that it is advanced in time relative to the reference clock by an amount which is approximately equal to the time required for a clock signal to travel from portions of the IC that are relatively close to the reference clock input pin to more remote portions of the IC. The advanced clock signal is transmitted to the above-mentioned more remote portions of the IC in lieu of the original reference clock signal, while the reference clock signal continues to be used near the reference clock input pin. In this way all portions of the IC receive synchronized clock signals, which facilitates synchronized operation of the IC, even at very high clock speeds.

The typical loop circuit 10 (see FIG. 1) has a phase frequency detector ("PFD") 12 for comparing the relative phases and frequencies of the reference clock signal 11 and a clock signal 21 that the loop circuit feeds back to the PFD. If the phase of the feed-back clock signal is behind the phase of the reference clock signal, the PFD produces a first type of output signal 13a. If the phase of the feed-back clock signal is ahead of the phase of the reference clock signal, the PFD produces a second type of output signal 13b. The first and second output signals of the PFD may be applied to a charge pump circuit 14, which charges or discharges the charge-storing element of a low-pass filter 16, depending on whether the PFD is producing the first or second output signal. The output signal of the low-pass filter may be applied as a control signal to a variable delay circuit or voltage controlled oscillator ("VCO") 18. If a variable delay circuit is used, the loop circuit is typically called a delay lock loop, and phase frequency detector 12 typically detects phase error (although it could alternatively additionally detect frequency error). The signal applied to the variable delay circuit for delay may be the reference clock signal 11a. If a VCO is used, the loop circuit is typically called a phase lock loop, and phase frequency detector 12 typically detects phase and frequency error. The output signal of the variable delay circuit or the VCO may be the advanced clock signal 19, i.e., the ultimately desired output of the loop circuit. This signal may also be applied to a fixed delay circuit 20, which simulates the clock signal transmission delay that the advanced clock signal is intended to compensate for. The output signal of the fixed delay circuit is the feed-back clock signal 21 applied to the PFD.

The loop circuit is typically arranged so that if the feed-back clock signal is behind or later in time than the reference clock signal, the delay of the variable delay circuit is lessened somewhat (or the frequency of the VCO is increased somewhat) until the phases of the signals applied to the PFD match one another. Conversely, if the feed-back clock signal is ahead of or earlier in time than the reference clock signal, the delay of the variable delay circuit is increased somewhat (or the frequency of the VCO is decreased somewhat) until the phases of the signals applied to the PFD match one another.

Particularly in the case of delay lock loop circuits, it will be noted that the amount of delay required from the variable delay circuit depends on the frequency of the reference clock signal. This is so because each feed-back clock signal transition that the PFD compares to a reference clock signal transition is derived from an earlier reference clock signal transition.

The usefulness of a loop circuit can be increased (thereby increasing the usefulness of the circuitry employing the loop circuit) by increasing the reference clock signal frequency range that the loop circuit can automatically adapt to. For example, it may be desirable to provide a loop circuit that can automatically adapt to reference clock signal frequencies in the range from about 30 to about 70 MHZ. A loop circuit should also not be unduly perturbed or misled by occasional noise or "glitches" in the reference clock signal, either while the loop circuit is attempting to lock on to the reference clock signal or during subsequent normal operation of the loop circuit.

In view of the foregoing, it is an object of this invention to provide improved circuitry and methods for control and operation of loop circuits.

It is a more particular object of this invention to provide improved circuitry and methods for controlling the low-pass filters that are typically included in loop circuits.

SUMMARY OF THE INVENTION

These and other objects of the invention are accomplished in accordance with the principles of the invention by providing circuitry which detects when the output signal of the low-pass filter in a loop circuit is approaching either the power voltage of the circuit ("VCC") or the ground voltage of the circuit ("VSS"). For example, the circuitry of this invention may detect when the output signal of the low-pass filter rises to a first threshold value VCC-A (where A is a predetermined first offset voltage). Similarly, the circuitry of this invention may detect when the output signal of the low-pass filter falls to a second threshold value VSS+B (where B is a predetermined second offset voltage). Each time that either of these conditions is detected, the manner in which the output signals of the PFD are used by the charge pump is reversed. In other words, if the PFD is producing an output signal that normally causes the charge pump to increase the charge on the charge-storing element in the low-pass filter when either of the above-mentioned threshold values is reached, then the circuitry of this invention switches that PFD output signal to one which causes the charge pump to begin decreasing the charge on the charge-storing element in the low-pass filter. Conversely, if the PFD is producing an output signal that normally causes the charge pump to decrease the charge in the low-pass filter when either of the threshold values is reached, then the circuitry of this invention switches that PFD output signal to one which causes the charge pump to begin increasing the low-pass filter charge.

In an alternative embodiment, the PFD is reset each time either of the above-mentioned threshold values is reached.

The circuitry of this invention may be combined with additional circuitry that makes coarser adjustments in the operation of the variable delay circuitry or VCO after a predetermined number of charging/discharging reversals of the type described in the preceding paragraph. For example, an appropriate coarse adjustment may be made after every second reversal of the type described above. In the case of a variable delay circuit, such a coarse adjustment may involve switching additional delay stages into the delay circuit or switching some delay stages out of that circuit. Or the coarse adjustment may involve inverting the output of the variable delay circuit in order to produce a 180° shift in the phase of the advanced clock signal.

Further features of the invention, its nature and various advantages will be more apparent from the accompanying drawings and the following detailed description of the preferred embodiments.

BRIEF DESCRIPTION OF THE DRAWINGS

FIGS. 8a–8d are signal waveform diagrams which are useful in explaining the operation of the circuitry of this invention.

DETAILED DESCRIPTION OF THE PREFERRED EMBODIMENTS

Figure 1:
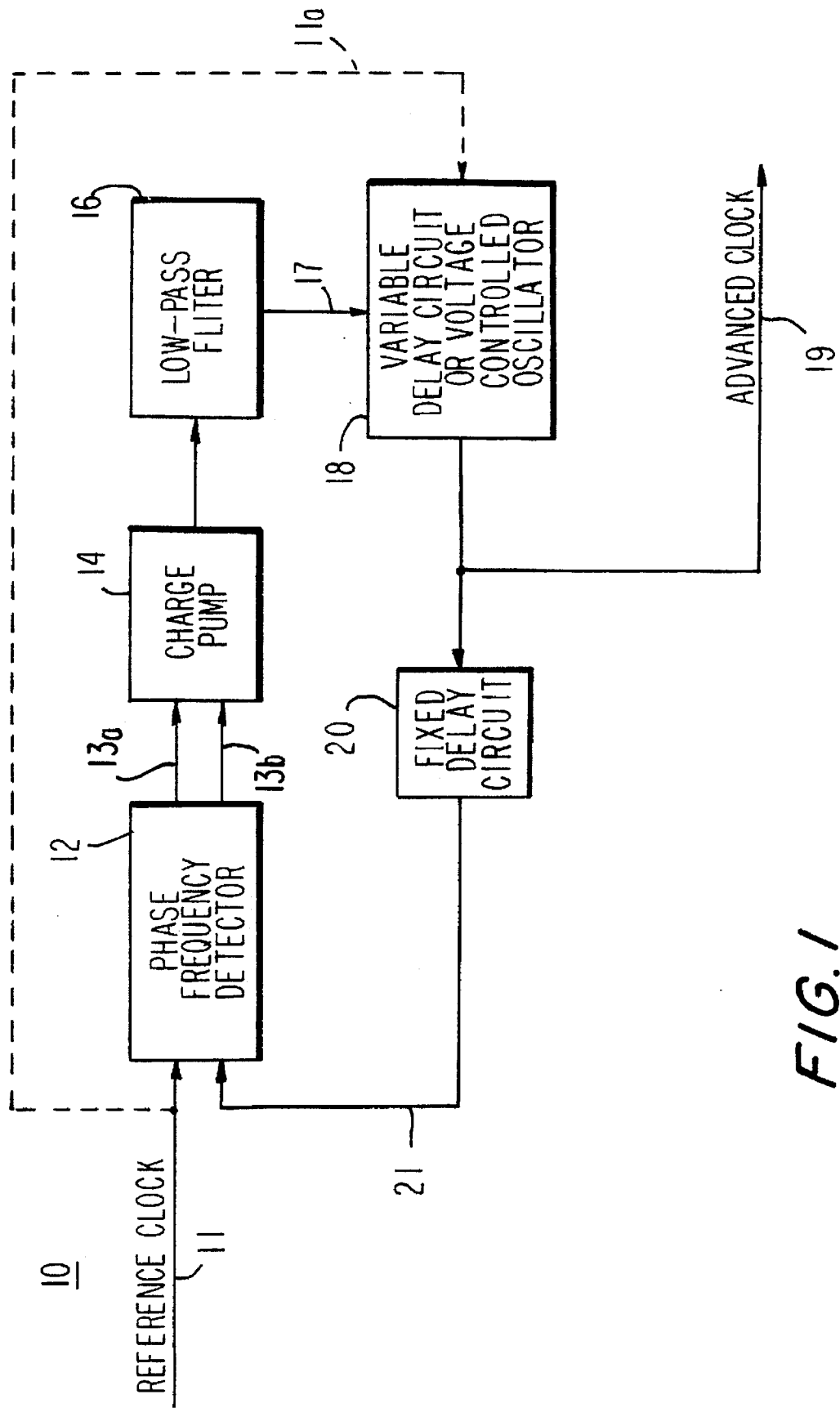
FIG. 1 is a simplified block diagram of a typical prior art delay lock loop or phase lock loop circuit.
Figure 2:
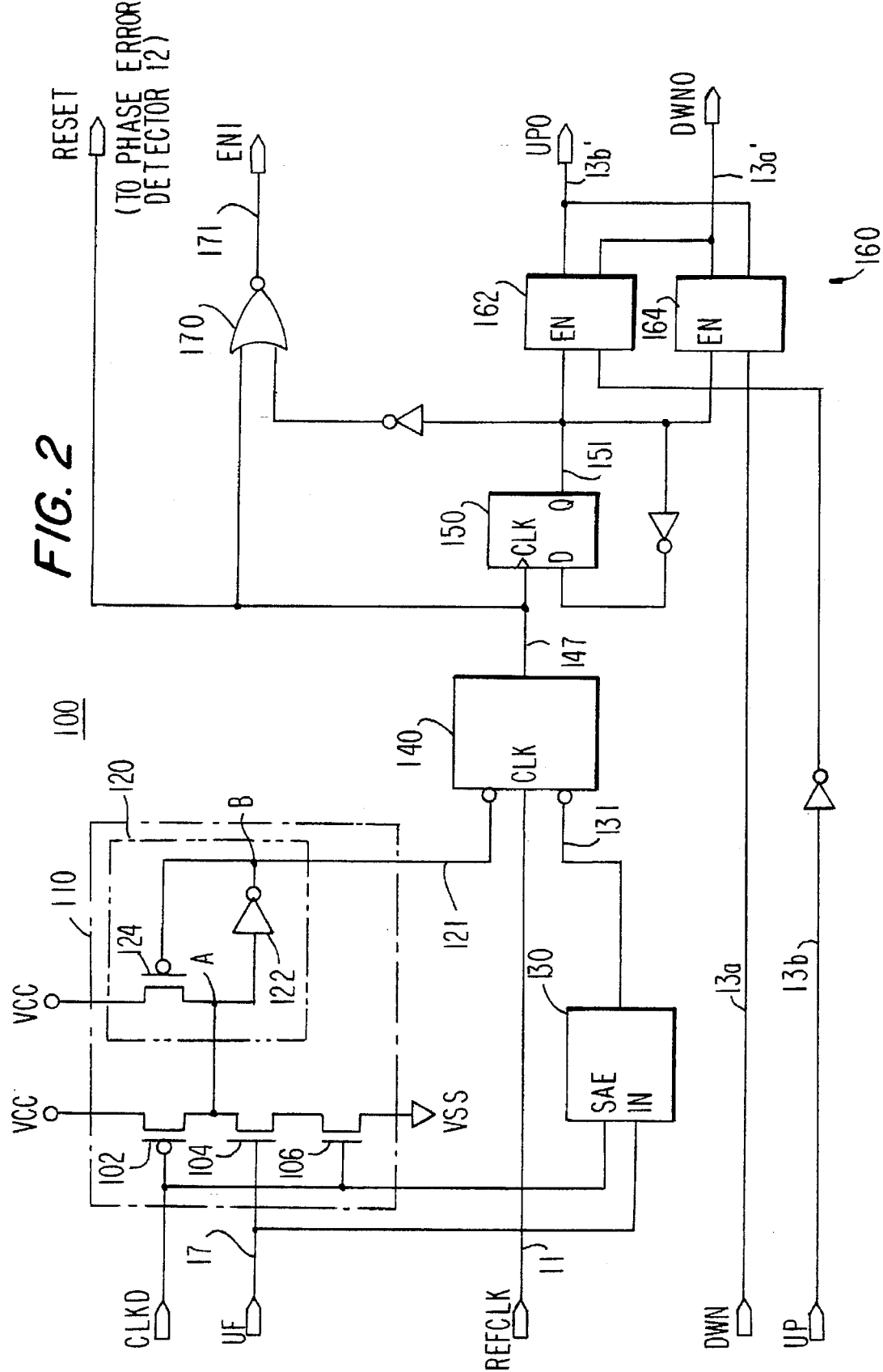
FIG. 2 is a simplified schematic block diagram of an illustrative embodiment of circuitry constructed in accordance with this invention which can be included in circuits of the type shown in FIG. 1.
Figure 7:
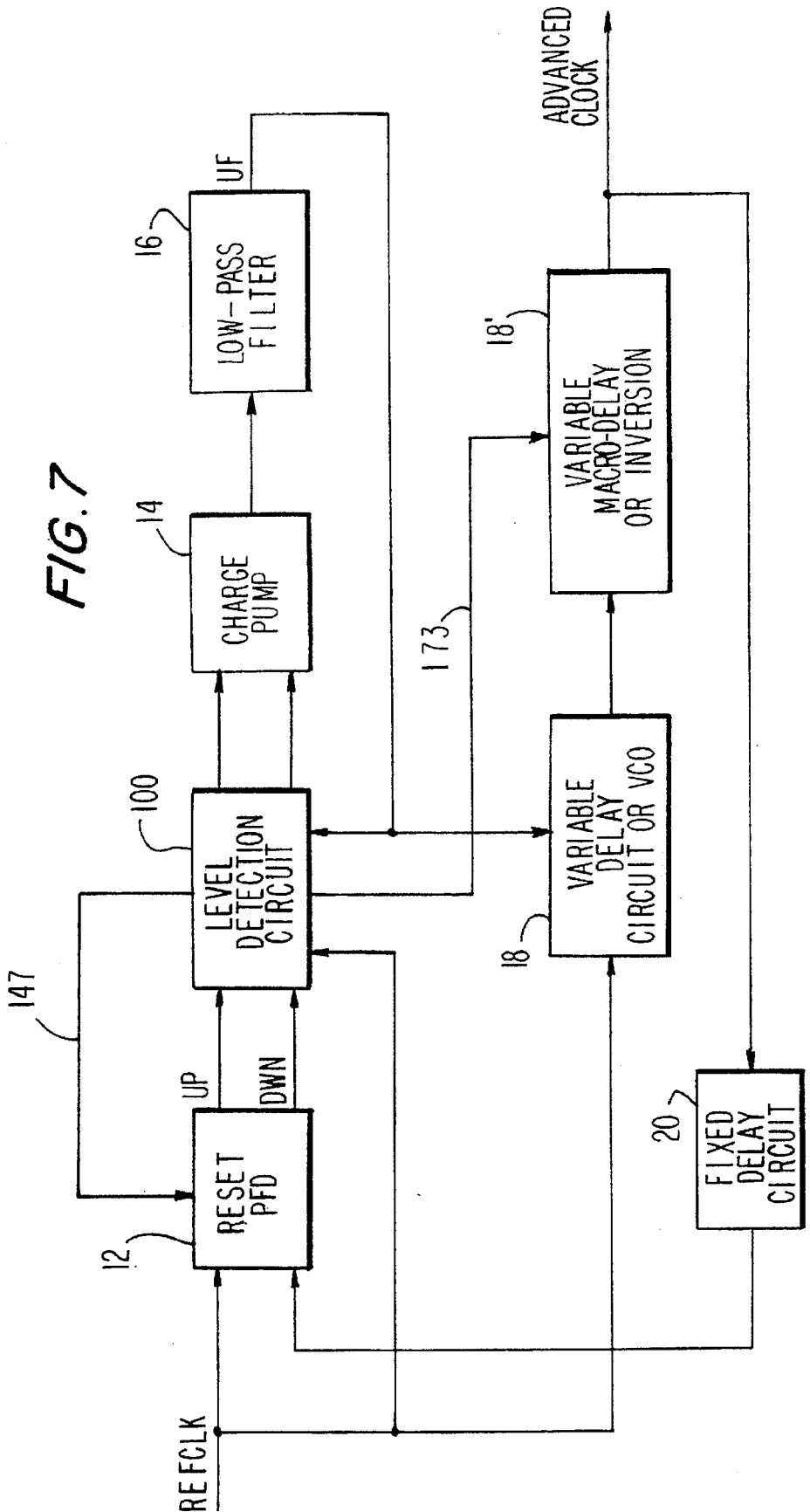
FIG. 7 is a simplified block diagram of an illustrative delay lock loop or phase lock loop constructed in accordance with this invention.

The illustrative embodiment of the circuitry 100 of this invention which is shown in FIG. 2 is intended for inclusion between PFD 12 and charge pump 14 in a loop circuit of the type shown in FIG. 1 (see FIG. 7). In FIG. 2 input CLKD is the reference clock signal 11 of FIG. 1, delayed by several gates (not shown). The UF input is the output signal 17 of low-pass filter 16 in FIG. 1. The REFCLK input is the reference clock signal 11 of FIG. 1. The DWN input is the output signal (e.g., 13a) of PFD 12, which normally would be used to cause charge pump 14 to increase the charge in low-pass filter 16. Such an increase in charge increases UF, which is assumed in the embodiment being discussed to increase the delay of variable delay circuit 18 (or to decrease the frequency of VCO 18). The UP input is the output signal (e.g., 13b) of PFD 12 which normally would be used to cause charge pump 14 to decrease the charge in low-pass filter 16. Such a decrease in charge decreases UF, which is assumed in the embodiment being discussed to decrease the delay of variable delay circuit 18 (or to increase the frequency of VCO 18). (Those skilled in the art will appreciate that the circuit could alternatively be constructed so that increasing charge in low-pass filter 16 decreases the delay of variable delay circuit 18 or increases the frequency of VCO 18, while decreasing charge in low-pass filter 16 increases the delay of variable delay circuit 18 or decreases the frequency of VCO 18.)

The UPO output 13b' is applied to charge pump 14 in place of the UP signal, and the DWNO output 13a' is applied to charge pump 14 in place of the DWN signal. The EN1 output signal 171 is optional and may be applied as a clock signal to a flip-flop (not shown) which controls a coarser adjustment of circuit 18 as will be discussed in more detail below. The RESET output signal 147 is also optional and may be applied to PFD 12 to reset the PFD as is also discussed in more detail below.

The circuitry inside box 110 in FIG. 2 detects when UF has fallen to a relatively low level (i.e., VSS+B). The components in box 120 (within box 110) comprise a one-way latch that is pulled high (at node A) by each low in the CLKD signal (which turns on P-channel transistor 102). While node A is sufficiently high, the output of inverter 122 is low, which turns on (relatively small) P-channel transistor 124. During each subsequent high in the CLKD signal, N-channel transistor 106 turns on. This allows N-channel transistor 104 to drain charge away from node A at a rate determined by the voltage of the UF signal. If voltage UF is higher than VSS+B, transistor 104 is turned on relatively strongly, and node A is pulled down far enough to cause node B to go high before the REFCLK signal can clock the low condition of node B into latch circuit 140. On the other hand, if voltage UF is VSS+B or below, transistor 104 is not turned on strongly enough to pull node A down far enough to raise node B before the REFCLK signal clocks the low condition of node B into latch circuit 140.

While circuit 110 thus detects when voltage UF has fallen to VSS+B or below, sense amplifier circuit 130 senses when voltage UF has risen to VCC-A or above. Sense amplifier 130 may be a conventional sense amplifier which is enabled by each high in the CLKD signal. When sense amplifier 130 is thus enabled, it pulls its output signal 131 low if voltage UF is at or above VCC-A. Otherwise the output signal of sense amplifier 130 remains high. Any low of the sense amplifier output is latched into latch circuit 140.

Figure 3:
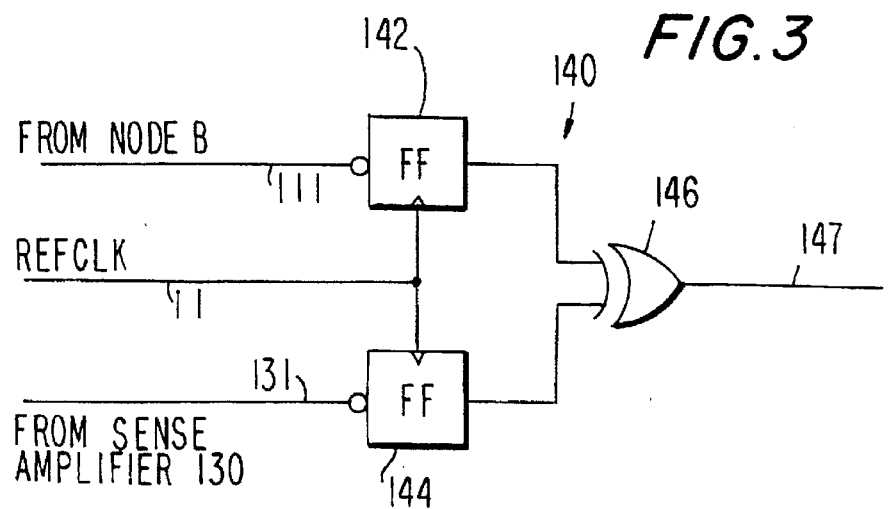
FIG. 3 is a more detailed, but still simplified, block diagram of an illustrative embodiment of a portion of the circuitry shown in FIG. 2 in accordance with this invention.

A more detailed, but still somewhat simplified, depiction of an illustrative embodiment of latch circuit 140 is shown in FIG. 3. In this embodiment latch circuit 140 includes a first flip-flop 142 and a second flip-flop 144, both of which are clocked by the REFCLK signal. The output signal of flip-flop 142 goes high if it is clocked while node B is low.

Similarly, the output signal of flip-flop 144 goes high if it is clocked while the output signal of sense amplifier 130 is low. The output signal 147 of EXCLUSIVE OR gate 146 (which is the output signal of latch circuit 140) goes high when the output signal of either flip-flop goes high. Thus a high output from latch circuit 140 indicates that voltage UF has either risen to VCC-A or has fallen to VSS+B.

The output signal of latch circuit 140 is applied as a clock input to toggle flip-flop 150. The output signal 151 of flip-flop 150 changes state each time the flip-flop is clocked.

The output signal of flip-flop 150 is applied in parallel to the control terminals of two demultiplexers 162 and 164, which collectively comprise steering logic circuit 160. The data input to demultiplexer 162 is the inverted UP signal. The data input to demultiplexer 164 is the DWN signal. When the output signal of flip-flop 150 has a first binary value, demultiplexer 162 connects its data input to the UPO output terminal 13b', and demultiplexer 164 connects its data input to the DWNO output terminal 13a'. On the other hand, when the output signal of flip-flop 150 has a second binary value, demultiplexer 162 connects its data input to the DWNO output terminal, and demultiplexer 164 connects its data input to the UPO output terminal. When the circuit begins operating, UP is connected to UPO through steering circuit 160, and DWN is connected to DWNO through circuit 160.. Thereafter, each time flip-flop 150 toggles, the connections through steering logic 160 are reversed. This reverses the charging/discharging operation of charge pump circuit 14. Such a reversal occurs each time voltage UF either rises to VCC-A or falls to VSS+B. UF is thereby prevented from being driven into the extremes of its possible operating range. This improves control of the circuitry 18 that is responsive to UF. It also helps prevent the circuit from over-reacting to possible noise in the REFCLK signal.

Figure 4:
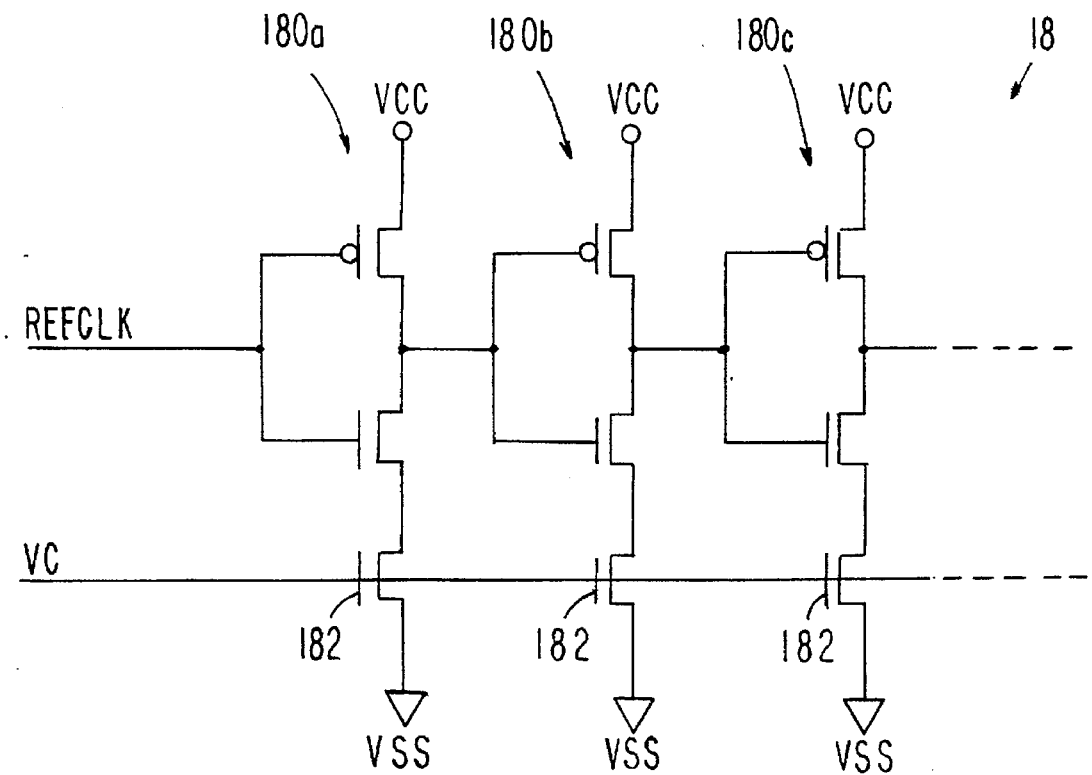
FIG. 4 is a schematic diagram of an illustrative implementation of another portion of the circuitry shown in FIG. 2.

For completeness, an illustrative embodiment of a variable delay implementation of circuit 18 is shown in FIG. 4. In this embodiment circuit 18 includes a plurality of inverter stages 180a, 180b, 180c, etc., connected in series. Each inverter stage includes a control transistor 182 in its connection to ground. Control transistors 182 are all controlled by the VC signal. If the voltage of the VC signal is relatively high, the REFCLK signal will propagate through inverter stages 180 faster than if the voltage of the VC signal is relatively low. VC is controlled by UF. In this Way the voltage of UF controls the amount of REFCLK signal delay that variable delay circuit 18 provides.

Figure 5:
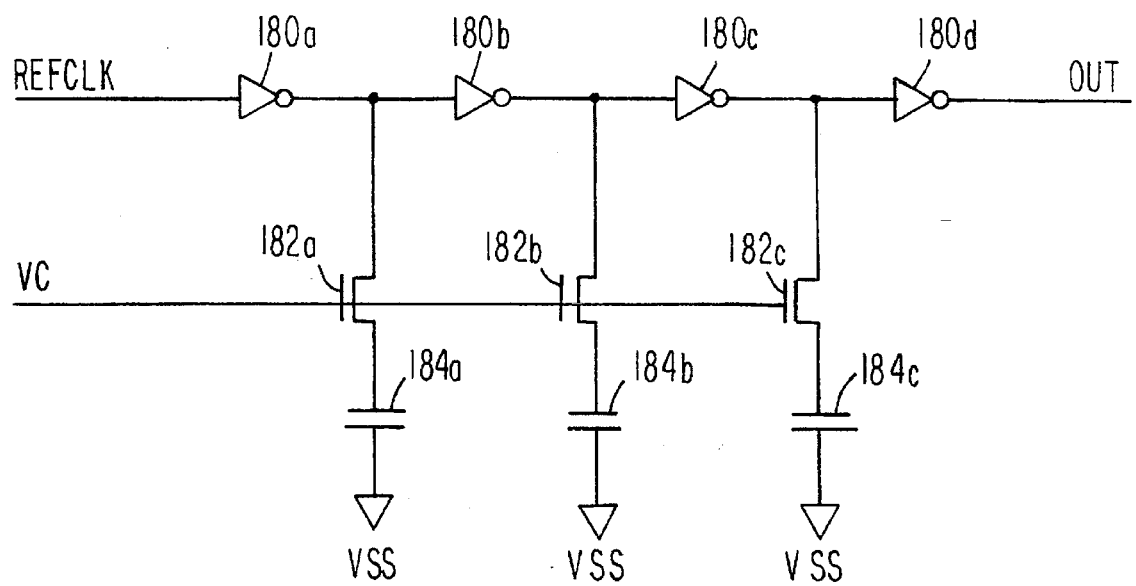
FIG. 5 is a schematic diagram of an alternative implementation of the portion of the circuitry shown in FIG. 4.

An alternative "capacitive load type" variable delay implementation of circuit 18 is shown in FIG. 5. Again in this embodiment, circuit 18 includes a plurality of inverter stages 180a, 180b, 180c, etc., connected in series. Each interstage node is connected to ground via a control transistor 182 and a capacitor 184. Transistors 182 are controlled by signal VC, which is controlled in turn by UF. The higher VC is, the more capacitive loading there is between the inverter stages, and the slower the inverters propagate the REFCLK signal to the output of circuit 18.

Figure 6:
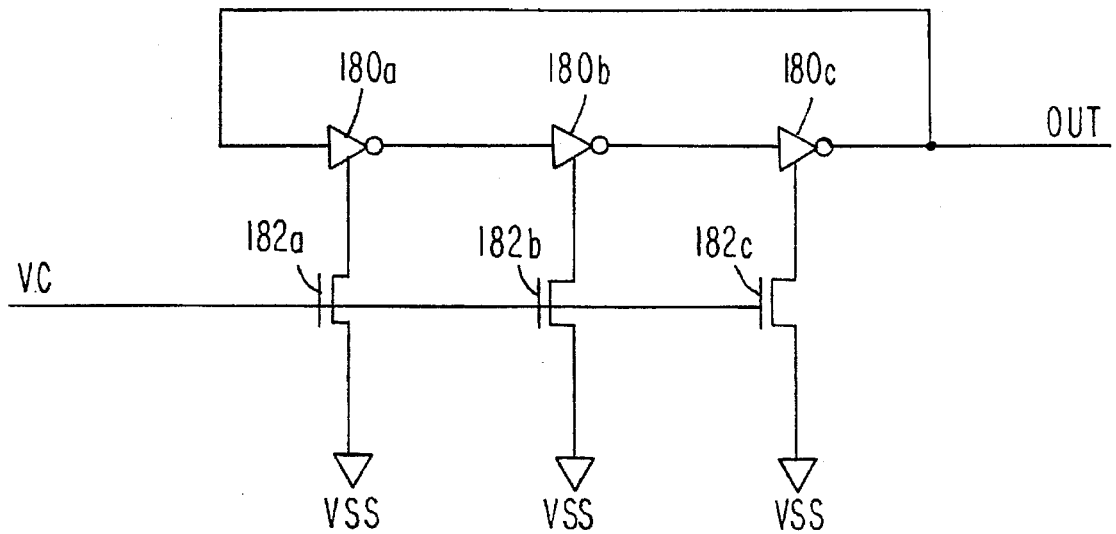
FIG. 6 is a schematic diagram of another alternative implementation of the portion of the circuitry shown in FIG. 4.

Another alternative embodiment of circuit 18 is shown in FIG. 6. In this case circuit 18 is a VCO. As in FIG. 4, inverters 180 propagate a signal faster when VC is relatively high, thereby increasing the frequency of the VCO output.

Still other possible embodiments of circuit 18 are a conventional differential style VCO or delay line.

If desired, the circuitry shown in FIG. 2 may also provide an input EN1 for a coarser control of circuit 18. For example, the output signal of latch circuit 150 may be one input to NOR gate 170. The inverted output of flip-flop 150 may be the other input to NOR gate 170. Accordingly, the output signal 171 or EN1 of NOR gate 170 will go low in response to every second clocking of flip-flop 150. The EN1 signal can be used to clock another flip-flop (not shown) which controls a coarser adjustment of circuit 18 than is provided by changes in UF. For example, the flip-flop clocked by EN1 may invert the output signal of circuit 18, thereby producing a 180° change in the phase of that signal. Alternatively, the flip-flop clocked by EN1 may change the phase of the output signal of circuit 18 less than 180°, e.g., by adding to or subtracting from the number of stages 180 in variable delay circuit 18. Making coarser adjustments to circuit 18 in this way helps extend the operating range of the loop circuit in a highly stable way. A coarse adjustment is not made until UF has twice run out of range. This reduces the likelihood that the loop circuit will respond to noise or other spurious pulses in the REFCLK signal by making an unwarranted coarse adjustment that would only have to be almost immediately reversed.

FIG. 7 shows an illustrative embodiment of the invention which includes the coarse adjustment feature described in the preceding paragraph. In this embodiment the output signal 173 of the flip-flop which receives signal 171 is applied to variable macro-delay or inversion circuit 18'. In response to signal 173, circuit 18' makes a relatively large change in the delay in the output signal of circuit 18 or inverts the output signal of circuit 18, depending on the construction selected for circuit 18'.

A possible additional feature is to use any high in the output signal 147 of latch circuit 140 to reset PFD 12 via the optional RESET output terminal shown in FIG. 2 (see also FIGS. 7 and 8a–8d). Resetting PFD 12 causes the UP and DWN signals of the PFD to be disabled during reset. This allows for glitches to settle during the time circuit 18' is being adjusted. After a predetermined number of cycles of the REFCLK and advanced clock signals (e.g., after two cycles of each of these signals), the reset condition of PFD 12 is released on the falling edge of the REFCLK signal. FIG. 8a shows an illustrative waveform for signal UF, and FIGS. 8b–8c show the responses of signals 147, 171, and 173 to that UF signal.

It will be understood that the foregoing is only illustrative of the principles of this invention, and that various modifications can be made by those skilled in the art without departing from the scope and spirit of the invention. For example, the particular types of variable delay or VCO circuitry shown in FIGS. 4–6 are only illustrative, and other types of variable delay or VCO circuitry can be used instead if desired.

The invention claimed is:

1. In a loop circuit which attempts to match the phase of a reference clock signal and the phase of a feed-back clock signal which is at least partly controlled by the loop circuit, the loop circuit including a power voltage source, a ground voltage source, a phase frequency detector for comparing the phases of the reference and feed-back clock signals and for producing a first or second output depending on whether the phase of the reference clock signal is ahead of or behind the phase of the feed-back clock signal, a low-pass filter for producing an output voltage which at least partly controls the phase of the feed-back clock signal, and a control circuit responsive to first or second inputs for causing the output voltage of said low-pass filter to increase or decrease depending on which of said first and second inputs is active, circuitry for selectively deriving said first and second inputs from said first and second outputs comprising:

a first circuit for producing a first output indication when said output voltage rises to within a first predetermined amount of the power voltage;

a second circuit for producing a second output indication when said output voltage falls to within a second predetermined amount of the ground voltage; and a steering circuit for selectively making either a first or a second set of connections, said first set of connections connecting said first output to said first input and connecting said second output to said second input, said second set of connections connecting said first output to said second input and connecting said second output to said first input, said steering circuit responding to each first or second output indication by changing from one of said first and second sets of connections to the other of said first and second sets of connections.

2. The apparatus defined in claim 1 wherein said loop circuit further includes variable delay circuitry, wherein production of said feed-back clock signal by said loop circuit includes passing said reference clock signal through said variable delay circuit, and wherein said output voltage at least partly controls the amount of delay of said reference clock signal in passing through said variable delay circuitry.

3. The apparatus defined in claim 1 wherein said loop circuit further includes a voltage controlled oscillator, wherein production of said feed-back clock signal includes production of a clock signal by said voltage controlled oscillator, and wherein said voltage controlled oscillator operates with a frequency that is at least partly determined by said output voltage.

4. The apparatus defined in claim 1 wherein said low-pass filter has a charge storing component, wherein said output voltage is indicative of how much charge is stored on said charge storing component, and wherein said control circuit includes a charge pump circuit for applying charge to or withdrawing charge from said charge storing component depending on which of said first and second inputs is active.

5. The apparatus defined in claim 1 further comprising:

a coarse adjustment circuit for selectively making a coarse adjustment to the phase of the feed-back clock signal; and a coarse adjustment enabling circuit for enabling said coarse adjustment in response to a predetermined number of said first and second output indications.

6. The apparatus defined in claim 5 wherein said coarse adjustment circuit comprises:

an inversion circuit for inverting said feed-back clock signal.

7. The apparatus defined in claim 1 further comprising:

a circuit for resetting said phase frequency detector for a predetermined time interval after each of said first and second output indications.

8. The method of operating a loop circuit which attempts to match the phase of a reference clock signal and the phase of a feed-back clock signal which is at least partly controlled by the loop circuit, the loop circuit including a power voltage source, a ground voltage source, a phase frequency detector for comparing the phases of the reference and feed-back clock signals and for producing a first or second output depending on whether the phase of the reference clock signal is ahead of or behind the phase of the feed-back clock signal, a low-pass filter for producing an output voltage which at least partly controls the phase of the feed-back clock signal, and a control circuit responsive to first or second inputs for causing the output voltage of said low-pass filter to increase or decrease depending on which of said first and second inputs is active, said method comprising the steps of:

monitoring said output voltage to produce an output indication when said output voltage rises to a first predetermined voltage which bears a predetermined relationship to said power voltage or when said output voltage falls to a second predetermined voltage which bears a predetermined relationship to said ground voltage;

deriving said first and second inputs from said first and second outputs according to first or second relationships, said first relationship being one in which said first and second inputs are respectively derived from said first and second outputs, and said second relationship being one in which said first and second inputs are respectively derived from said second and first outputs; and changing from one of said first and second relationships to the other of said first and second relationships in said deriving step each time said monitoring step results in production of said output indication.

9. The method defined in claim 8 wherein said first predetermined voltage is below said power voltage by a first predetermined offset amount.

10. The method defined in claim 8 wherein said second predetermined voltage is above said ground voltage by a second predetermined offset amount.

11. The method defined in claim 8 further comprising the step of:

making a coarse adjustment to the phase of the feed-back clock signal in response to a predetermined number of said output indications.

12. The method defined in claim 11 wherein said making a coarse adjustment step comprises the step of:

inverting said feed-back clock signal.

13. The method defined in claim 8 further comprising the step of:

resetting said phase frequency detector for a predetermined time interval after each of said first and second output indications.

14. In a loop circuit which attempts to match the phase of a reference clock signal and the phase of a feed-back clock signal which is at least partly controlled by the loop circuit, the loop circuit including a power voltage source, a ground voltage source, a phase frequency detector for comparing the phases of the reference and feed-back clock signals and for producing a first or second output depending on whether the phase of the reference clock signal is ahead of or behind the phase of the feed-back clock signal, a low-pass filter for producing an output voltage which at least partly controls the phase of the feed-back clock signal, and a control circuit responsive to said first and second outputs for causing the output voltage of said low-pass filter to increase or decrease depending on which of said first and second outputs is active, circuitry for selectively resetting said phase frequency detector comprising:

a first circuit for producing a first output indication when said output voltage rises to within a first predetermined amount of the power voltage;

a second circuit for producing a second output indication when said output voltage falls to within a second predetermined amount of the ground voltage; and a third circuit for resetting said phase frequency detector in response to either said first output indication or said second output indication.

15. The apparatus defined in claim 14 wherein said third circuit resets said phase frequency detector for a predetermined time interval after occurrence of either said first output indication or said second output indication.

16. The apparatus defined in claim 15 wherein said third circuit resets said phase frequency detector for a predetermined number of cycles of said reference clock signal after occurrence of either said first output indication or said second output indication.

17. The method of operating a loop circuit which attempts to match the phase of a reference clock signal and the phase of a feed-back clock signal which is at least partly controlled by the loop circuit, the loop circuit including a power voltage source, a ground voltage source, a phase frequency detector for comparing the phases of the reference and feed-back clock signals and for producing a first or second output depending on whether the phase of the reference clock signal is ahead of or behind the phase of the feed-back clock signal, a low-pass filter for producing an output voltage which at least partly controls the phase of the feed-back clock signal, and a control circuit responsive to said first and second outputs for causing the output voltage of said low-pass filter to increase or decrease depending on which of said first and second outputs is active, said method comprising the steps of:

producing a first output indication when said output voltage rises to within a first predetermined amount of the power voltage;

producing a second output indication when said output voltage falls to within a second predetermined amount of the ground voltage; and resetting said phase frequency detector in response to either said first output indication or said second output indication.

18. The method defined in claim 17 wherein said resetting step resets said phase frequency detector for a predetermined time interval after occurrence of either said first output indication or said second output indication.

19. The method defined in claim 18 wherein said resetting step resets said phase frequency detector for a predetermined number of cycles of said reference clock signal after occurrence of either said first output indication or said second output indication.

* * * * *